United States Patent [19]

Callahan

[11] 4,344,050

[45] Aug. 10, 1982

[54] DUAL CHANNEL DIGITALLY SWITCHED CAPACITOR FILTER

[75] Inventor: Kent R. Callahan, Lynwood, Wash.

[73] Assignee: American Microsystems, Inc., Santa Clara, Calif.

[21] Appl. No.: 189,709

[22] Filed: Sep. 22, 1980

[51] Int. Cl.³ .................. H03H 19/00; H03K 4/00
[52] U.S. Cl. ................................ 333/173; 307/242; 328/151
[58] Field of Search .................. 333/173, 19–20; 328/167, 150, 151, 165, 145; 307/242, 269, 490, 492, 227, 228, 352, 353, 529, 555

[56] References Cited

U.S. PATENT DOCUMENTS 3,597,707 8/1971 Chao et al. .................. 333/173 X
4,179,665 12/1979 Gregorian .................. 333/173 X

OTHER PUBLICATIONS

Rogers–"The Theory of Networks in Electrical Communication and Other Fields", MacDonald, London, 1957, title page and pp. 437–439.

Primary Examiner—Marvin L. Nussbaum
Attorney, Agent, or Firm—Alan H. MacPherson; Steven F. Caserza; Richard Franklin

[57] ABSTRACT

A switched capacitor filter is designed utilizing two parallel switched capacitor charge pumps. These two, parallel charge pumps operate out of phase with each other, thereby allowing charging of a storage capacitor at a rate equal to twice the clock frequency, thereby decreasing incremental voltage steps during the charging of the storage capacitor.

5 Claims, 6 Drawing Figures

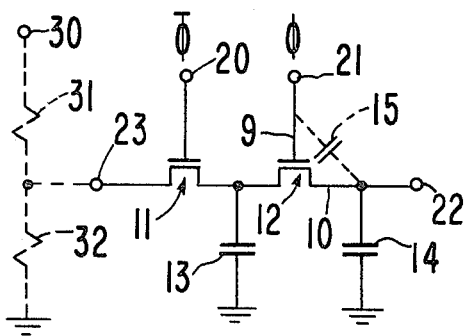
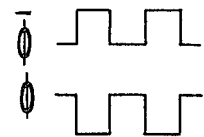
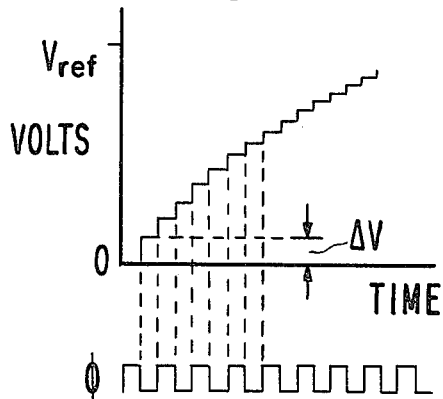
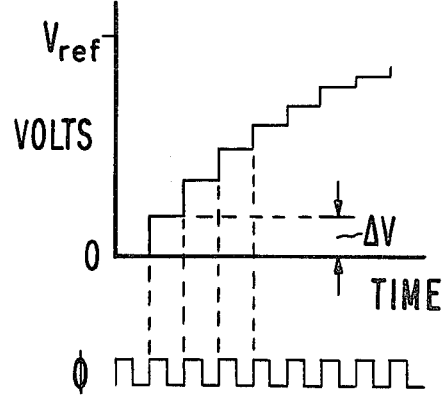
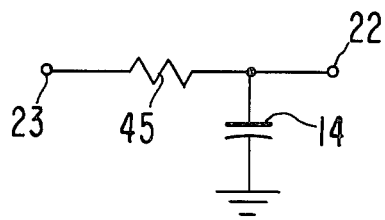
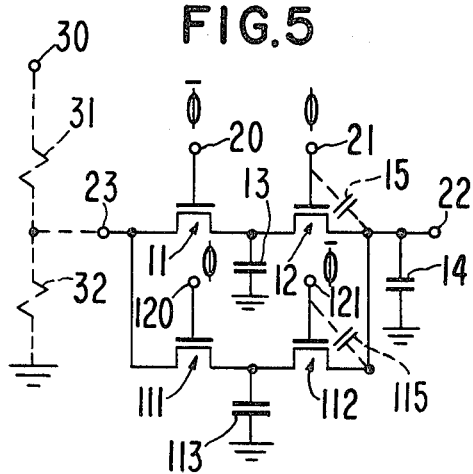

DUAL CHANNEL DIGITALLY SWITCHED CAPACITOR FILTER

BACKGROUND OF THE INVENTION

1. Field of the Invention

This invention relates to switched capacitor filters, and more specifically to switched capacitor filters useful in the generation of exponential envelope voltages used in electronic organs.

2. Description of the Prior Art

Prior art methods of generating exponential envelope voltages for use in electronic organs are well known. The circuit as shown in FIG. 1 is commonly used for this purpose (see, for example, the article by David L. Fried entitled "Analog Sample-Data Filters" published on pages 302 to 304 of the IEEE Journal of Solid-State Circuits in August 1972). In the circuit of FIG. 1, a reference voltage ($V_{ref}$) is applied at node 23. This reference voltage may be obtained by any well known means, the simplest of which is a voltage divider consisting of resistors 31 and 32 connected between a source of potential at node 30 and ground as shown in FIG. 1. The two nonoverlapping clock signals required to operate the circuit of FIG. 1 are shown in FIG. 2, and are labeled $\phi$ and $\overline{\phi}$. The switches used in the circuit of FIG. 1 are shown to be MOSFET transistors 11 and 12, however, any suitable switch means may be used. In the operation of the circuit of FIG. 1, initially the voltages appearing on capacitors 13 and 14 are zero. During the first half clock period when $\overline{\phi}$ is high, switch 11 is turned on and capacitor 13 (having a capacitance value $C_1$) is charged through switch 11 to $V_{ref}$ as applied to node 23. The amount of charge stored on capacitor 13 is simply $C_1 V_{ref}$. During the second half of the first clock period, $\phi$ is high, and $\overline{\phi}$ is low. This causes switch 11 to turn off and switch 12 to turn on. Thus the charge previously stored on capacitor 13 is shared with capacitor 14 (having capacitance value $C_2$) through the path provided by the open switch 12. The resulting voltage across capacitor 14 is thus $Q/(C_1+C_2)$ or $[C_1/(C_1+C_2)] V_{REF}$. $\phi$ then goes low, and $\overline{\phi}$ goes high. During the first half of the second clock period, capacitor 13 is again charged to $V_{ref}$ through switch 11. During the second half of the second clock period $\overline{\phi}$ goes low and $\phi$ goes high thus causing the charge stored on capacitor 13 to again be shared with capacitor 14. Thus the voltage on capacitor 14 becomes $$\left[ \frac{C_1}{C_1 + C_2} + \frac{C_1 C_2}{(C_1 + C_2)^2} \right] V_{REF}.$$

A graphical representation of the voltage available at node 22 with respect to time is shown in FIG. 3. Note that the initial step is rather large, and subsequent steps occurring during subsequent clock cycles become smaller and smaller, thus resulting in an approximately exponential voltage rise on node 22.

An RC circuit equivalent to the circuit of FIG. 1 is shown in FIG. 4. With a reference voltage applied to terminal 23, capacitor 14 will charge through resistor 45 resulting in a voltage varying exponentially with time appearing on terminal 22. The circuit of FIG. 1 will approximate this RC circuit with resistor equivalent capacitor 13. The time constant of the circuit of FIG. 1 will be equal to $tC_2/C_1$ where $t$ is the period of clock pulses $\phi$ and $\overline{\phi}$. Thus, the time constant of a switched capacitor equivalent circuit may be changed simply by changing the period of $\phi$ and $\overline{\phi}$. Furthermore, in MOS integrated circuits, resistance values are not highly controllable due to process limitations, while capacitance ratios are highly controllable, because capacitor size is quite controllable, and dielectric thickness is quite uniform across each semiconductor die. The high resistor values required to generate slow exponential voltages would also consume too much space on a semiconductor die to be practical. For these reasons, switched capacitor "resistor-equivalent" circuits are favored over simple RC circuits in MOS applications.

One disadvantage in the prior art circuit of FIG. 1 is due to the parasitic capacitance inherent in MOSFET transistors. Such a parasitic capacitor is shown in dashed lines in FIG. 1 as capacitor 15 appearing between gate 9 and drain 10 of MOSFET 12. This causes the output voltage stored on capacitor 14 and available on node 22 to be degraded due to charge sharing with capacitor 15. Thus, after the first clock period, when $\phi$ goes low and switch 12 turns off, the actual voltage available on capacitor 14 will be approximately equal to $$\frac{C_1 C_2}{(C_1 + C_2)(C_2 + C_3)} V_{REF}$$

where $C_3$ is the capacitance value of parasitic capacitor 15. This voltage degradation is referred to as "pickoff". Pickoff generates a noise component seen across capacitor 14 and appearing on node 22. The frequency of pickoff is equal to the sampling frequency, $f_\phi$.

SUMMARY OF THE INVENTION

This invention utilizes two parallel switched capacitor charge pumps operating out of phase. This results in a doubling of the output voltage step frequency, thus resulting in a smoother exponential voltage generation. Thus the output voltage filtering requirements are less stringent than for prior art circuits due to the higher sampling frequency of the circuit of this invention which reduces the noise effects on the output signal due to a decrease in magnitude of output voltage steps. The frequency of the noise is also doubled and thus further removed from the audio range. This also results in less stringent output filtering requirements. If the input signal to the filter of this circuit is an A.C. signal, effects on the output signal due to aliasing are reduced, due to the higher sampling frequency. This invention also provides a circuit with lower power dissipation than prior art circuits. Finally pick off is eliminated with the circuit of this invention by eliminating the change in output voltage due to parasitic capacitance as each clock switches between logic states.

BRIEF DESCRIPTION OF THE DRAWINGS

FIG. 1 is a schematic diagram of a prior art single channel digitally switched capacitor filter.

FIG. 2 is a drawing of the clock pulses required to operate the circuit of FIG. 1.

FIG. 3 is a graphical representation of the voltage on the storage capacitor of FIG. 1 with respect to time.

FIG. 4 is an RC circuit equivalent to the switched capacitor filter circuit of FIG. 1.

FIG. 5 is a schematic diagram of the dual channel digitally switched capacitor filter of this invention.

FIG. 6 is a graphical representation of the voltage stored on the storage capacitor 14 of the circuit of FIG. 5 with respect to time.

DETAILED DESCRIPTION

FIG. 5 shows a schematic diagram of a dual channel digitally switched capacitor filter constructed in accordance with this invention. A voltage divider comprised of resistors 31 and 32 is again shown to be a source of a reference voltage $V_{ref}$ applied to node 23. Of course this reference voltage may be generated by any desired method. MOS transistor switches 11 and 12, and capacitors 13 and 14 comprise a circuit identical to the prior art circuit of FIG. 1. However, connected in parallel with this circuit is a second switched capacitor charge pump circuit comprised of MOS transistor switches 111, and 112, and storage capacitor 113.

In the operation of the circuit of FIG. 5, voltages on capacitors 13, 14 and 113 are initially all equal to zero. Capacitors 13 and 113 are of equal value, each being equal to $\frac{1}{2} C_1$, where $C_1$ is the capacitance value of capacitor 13 of FIG. 1. During the first half clock period, $\bar{\phi}$ is high, and $\phi$ is low. With a high applied to node 20 from $\bar{\phi}$, MOSFET switch 11 is turned on, thus causing capacitor 13 to be charged to $V_{ref}$. During the second half of the first clock period, $\phi$ is high and $\bar{\phi}$ is low. With a high connected to node 21 from $\phi$, MOSFET switch 12 is turned on thus causing the charge stored on capacitor 13 to be shared with capacitor 14, as in the prior art circuit of FIG. 1. However, a high from $\phi$ is also applied to terminal 120, thus causing MOSFET switch 111 to turn on, and causing capacitor 113 to be charged to $V_{ref}$. During the first half of the second clock period, $\bar{\phi}$ is high, and $\phi$ is low. This causes MOSFET switch 11 to again turn on causing capacitor 13 to be charged to $V_{ref}$. Furthermore, a high $\bar{\phi}$ is applied to terminal 121, thus causing MOSFET switch 112 to conduct, thus sharing the charge stored on capacitor 113 with capacitor 14. In this manner, the charging frequency of capacitor 14 is equal to twice the clock frequency of $\phi$ and $\bar{\phi}$.

The resulting output voltage generated on capacitor 14 and available at terminal 22 is shown in FIG. 6. Since the frequency of charging capacitor 14 is equal to $2f_{100}$, the output voltage at node 22 will have two steps per period of clocks $\phi$ and $\bar{\phi}$ as opposed to one step for the prior art circuit of FIG. 1. As shown in FIG. 6, this results in twice as many steps, each of a smaller incremental increased voltage than the output of the circuit of FIG. 1 due to capacitors 13 and 113 each having capacitance $\frac{1}{2} C_1$. Thus, the output voltage available from output capacitor 14 through terminal 22 will be much smoother than the output voltage from prior art systems, while maintaining the same exponential waveform shape. This reduces the filtering requirements of the circuit of this invention over the prior art circuit of FIG. 1. With the charge-pump frequency of capacitor 14 essentially doubled, the possibility of aliasing is also reduced over prior art circuits, if an A.C. signal is used as the input signal applied to input terminal 23.

Another advantage obtained in the use of the dual channel filter of this invention is a reduction in power consumption of the circuit. Referring again to FIG. 1, if $V_{ref}$ is generated by the voltage divider comprised of resistors 31 and 32, a constant current will flow through the divider. The resistance value of resistor 31 is R and the resistance of MOSFET switch 11 is $R_Q$. If capacitor 13 cannot fully charge to $V_{ref}$ (approximately 2.2 time constants) during the time $\bar{\phi}$ is high (switch 11 on), the circuit of FIG. 1 will not function properly. Since the charging time constant of capacitor 13 is equal to $(R+R_Q) C_1$, it may be reduced by either decreasing R or $C_1$. ($R_Q$ is very low and process dependant.) Decreasing R will result in an undesired increase in power consumption. The capacitance of capacitor 13 may be decreased, but this requires the capacitance of capacitor 14 to decrease as well, in order to maintain the capacitance ratio of capacitors 13 and 14, and thus maintain the filter characteristics. However, a decrease in the value of capacitor 14 will result in an increase in pickoff noise, due to a greater effect of parasitic capacitor 15, more leakage noise and more noise associated with the turning on and off of MOSFET switch 12.

These problems are overcome by utilizing the circuit of this invention. Referring to FIG. 5, capacitors 13 and 113 each have capacitance equal to $\frac{1}{2} C_1$. Thus, with a resistor 31 of identical value as the prior art circuit of FIG. 1, the time constant of each channel of the circuit of this invention is reduced by a factor of 2. Thus, the time required to charge capacitors 13 and 113 is reduced over prior art circuits, without an increase in power consumption or noise components of the output voltage.

Pickoff noise is also reduced over prior art circuits. In the prior art circuit of FIG. 1, the parasitic capacitor 15 of MOSFET switch 12 causes a degradation of the charge on capacitor 14, and thus a degradation of the output voltage available at terminal 22. The capacitance effect of capacitor 15 varies when $\phi$ (applied to terminal 21) switches between a logical high and a logical low. In the circuit of FIG. 5, there are two parasitic capacitors 15 and 115 connected between output terminal 22 and $\phi$ and $\bar{\phi}$, respectively. Thus, there is always one parasitic capacitor connected between output terminal 22 and a logical high and one parasitic capacitor connected between output terminal 22 and a logical low. This effectively eliminates any change in output voltage on output terminal 22 due to parasitic capacitance, as $\phi$ and $\bar{\phi}$ switch between their high and low states, thus eliminating the effects of pickoff.

Persons skilled in the design and fabrication of semiconductor integrated circuits are capable of implementing the circuit of this invention in the form of integrated circuits, utilizing standard design and processing techniques. Construction of the circuit of this invention as a semiconductor integrated circuit is the preferred embodiment, due to the resulting small size, low power requirements and cost savings obtained.

I claim:

1. A dual channel digitally switched capacitor filter comprising:
    an input terminal for receiving a reference voltage;
    an output terminal;
    an output storage capacitor connected between said output terminal and ground; and
    a first and a second switched capacitor resistor equivalent connected in parallel, each having an input lead and an output lead, wherein said switched capacitor resistor equivalent input leads are connected to said input terminal and said switched capacitor resistor equivalent output leads are connected to said output terminal, wherein each said switched capacitor resistor equivalent comprises:
    a first switch means connected between said input terminal and a first plate of an intermediate storage capacitor having two plates, said other plate of said intermediate storage capacitor being connected to ground; and a second switch means connected between said first plate of said intermediate storage capacitor and said output terminal, and wherein said first switch means of said first switched capacitor resistor equivalent and said second switch means of said second switched capacitor resistor equivalent are controlled by a first of two non-overlapping clock pulses and said second switch means of said first switched capacitor resistor equivalent and said first switch means of said second switched capacitor resistor equivalent are controlled by a second of two nonoverlapping clock pulses.

2. Structure as in claim 1 wherein a reference voltage generated from a resistive voltage divider is applied to said input terminal.

3. A method for generating voltages which vary exponentially with time comprising the steps of:
(a) generating a reference voltage;
(b) storing said reference voltage in a first intermediate storage capacitor;
(c) discharging said first intermediate storage capacitor into an output storage capacitor and sumultaneously storing said reference voltage in a second intermediate storage capacitor;
(d) discharging said second intermediate storage capacitor into said output storage capacitor and simultaneously storing said reference voltage in said first intermediate storage capacitor;
(e) alternately repeating steps (c) and (d), whereby a voltage on said output storage capacitor is generated which approximates an exponential voltage rise.

4. Structure for generating voltages which vary exponentially with time comprising:
an input terminal;
an output terminal;
an output capacitor connected between said output terminal and ground;
a first path between said input terminal and said output terminal containing a first intermediate node;
a first switch means connected in said first path between said input terminal and said first intermediate node;
a second switch means connected in said first path between said output terminal and said first intermediate node;
a first intermediate storage capacitor connected between said first intermediate node and ground;
a second path between said input terminal and said output terminal containing a second intermediate node;
a third switch means connected in said second path between said input terminal and said second intermediate node;
a fourth switch means connected in said second path between said output terminal and said second intermediate node, and
a second intermediate storage capacitor connected between said second intermediate node and ground,
wherein said first and said fourth switch means are controlled by a first of two non-overlapping clock pulses and said second and said third switch means are controlled by a second of two non-overlapping clock pulses.

5. Structure as in claim 1 or 4 wherein said switch means are MOS field effect transistors.

* * * * *

UNITED STATES PATENT AND TRADEMARK OFFICE
CERTIFICATE OF CORRECTION

PATENT NO. : 4,344,050

DATED : August 10, 1982

INVENTOR(S) : Kent R. Callahan, Lynwood, Washington

It is certified that error appears in the above—identified patent and that said Letters Patent is hereby corrected as shown below:

On the title page

In the Abstract, line 2, after "two" delete the comma;

Column 3, line 44, delete "$2f_{100}$" and substitute -- $2f_{\emptyset}$--;

Column 4, line 41, delete "$\emptyset$" and substitute --$\bar{\emptyset}$--

Column 5, line 26, delete "sumultane-" and substitute --simultane---.

Signed and Sealed this

Fourteenth Day of December 1982

[SEAL]

Attest:

GERALD J. MOSSINGHOFF

Attesting Officer    Commissioner of Patents and Trademarks